(12) United States Patent  
Hashimoto

(10) Patent No.: US 8,222,150 B2
(45) Date of Patent: Jul. 17, 2012

(54) METHOD OF MANUFACTURING SEMICONDUCTOR DEVICE, TEMPLATE, AND METHOD OF CREATING PATTERN INSPECTION DATA

(75) Inventor: Koji Hashimoto, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 331 days.

(21) Appl. No.: 12/683,876

(22) Filed: Jan. 7, 2010

(65) Prior Publication Data

US 2010/0248482 A1    Sep. 30, 2010

(30) Foreign Application Priority Data

Mar. 31, 2009    (JP) ................................. 2009-086917

(51) Int. Cl.
*H01L 21/306* (2006.01)
(52) U.S. Cl. ................. 438/700; 257/E21.215
(58) Field of Classification Search .................. 438/700; 257/E21.215
See application file for complete search history.

(56) References Cited

U.S. PATENT DOCUMENTS

| | | | |
|---|---|---|---|
| 6,964,793 B2 * | 11/2005 | Willson et al. ................. | 427/466 |
| 7,303,383 B1 * | 12/2007 | Sreenivasan et al. ......... | 425/174.4 |
| 7,432,634 B2 * | 10/2008 | Choi et al. .................... | 310/323.17 |
| 2008/0286449 A1 | 11/2008 | Park | |

FOREIGN PATENT DOCUMENTS

| | | |
|---|---|---|
| JP | 2000-194142 | 7/2000 |
| JP | 2001-068411 | 3/2001 |
| JP | 2007-130871 | 5/2007 |
| JP | 2007-144995 | 6/2007 |
| JP | 2008-218690 | 9/2008 |
| KR | 10-2004-0004401 | 1/2004 |
| WO | WO 02/067055 A2 | 8/2002 |
| WO | WO 2008/005087 A2 | 1/2008 |
| WO | WO 2008/032416 A1 | 3/2008 |
| WO | WO 2008/033695 A2 | 3/2008 |

OTHER PUBLICATIONS

Notice of Rejection issued by the Japanese Patent Office on May 31, 2011, for Japanese Patent Application No. 2009-086917, and English-language translation thereof.

* cited by examiner

*Primary Examiner* — Trung Q Dang
(74) *Attorney, Agent, or Firm* — Finnegan, Henderson, Farabow, Garrett & Dunner, L.L.P.

(57) ABSTRACT

A method of manufacturing a semiconductor device according to an embodiment of the present invention includes mask layer on a processing target, pressing a template having a pattern having closed loop structure against the mask layer via an imprint material to solidify the imprint material, etching the mask layer by using the imprint material to form a mask, removing a part of the pattern having the closed loop of the mask, and etching the processing target by the mask including the pattern, the part of which is removed.

7 Claims, 15 Drawing Sheets

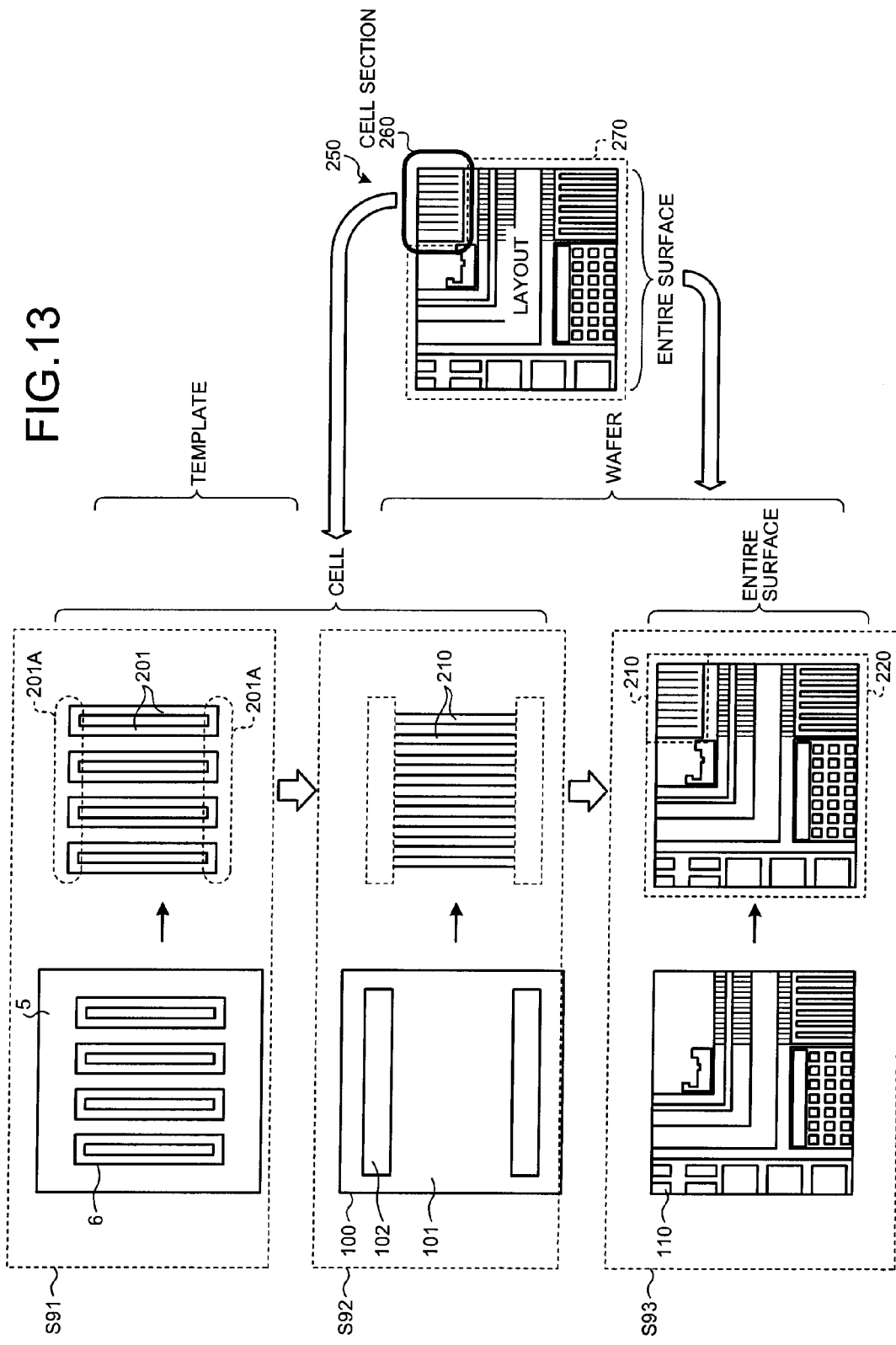

METHOD OF MANUFACTURING SEMICONDUCTOR DEVICE, TEMPLATE, AND METHOD OF CREATING PATTERN INSPECTION DATA

CROSS-REFERENCE TO RELATED APPLICATIONS

This application is based upon and claims the benefit of priority from the prior Japanese Patent Application No. 2009-86917, filed on Mar. 31, 2009; the entire contents of which are incorporated herein by reference.

BACKGROUND OF THE INVENTION

1. Field of the Invention

The present invention relates to a method of manufacturing a semiconductor device using an imprint method, a template used in the imprint method, and a method of creating pattern inspection data for inspecting the template and a pattern formed by the template.

2. Description of the Related Art

In recent years, according to the advance of microminiaturization of semiconductor devices, problems in a photolithography step used in a manufacturing process for the semiconductor devices are becoming conspicuous. Under design rules for most advanced semiconductor devices at the present, the semiconductor devices are microminiaturized to about several tens nanometers in a half pitch (hp). In lithography performed by reduced pattern transfer using light in the past, because resolution is insufficient, it is difficult to form patterns. Therefore, in recent years, a nano-imprint technology is proposed instead of such lithography.

The nano-imprint technology is a method of bringing a mold (a template) of a master, on which a pattern that should be transferred is formed in advance, into contact with an organic material applied over a processing target substrate and hardening the organic material while applying light or heat thereto to thereby transfer the pattern to an organic material layer (see, for example, Japanese Patent Application Laid-Open No. 2001-68411 and Japanese Patent Application Laid-Open No. 2000-194142).

As a method of manufacturing the template used in the nano-imprint technology, a method of forming patterns on sidewalls of core patterns and processing a template substrate using the sidewall pattern is known (see, for example, US patent application publication No. 2008/0286449).

BRIEF SUMMARY OF THE INVENTION

A method of manufacturing a semiconductor device according to an embodiment of the present invention comprises: forming a first mask layer on a processing target; pressing a template having a first pattern having closed loop structure against the first mask layer via an imprint material and solidifying the imprint material to perform imprint; etching the first mask layer using the solidified imprint material as a mask to form a first mask including a second pattern having the closed loop structure; forming a first processing pattern above the first mask; performing, using the first processing pattern, removal of the closed loop structure by removing a part of the second pattern of the first mask to form a second mask; and etching the processing target using the second mask including the second pattern, the part of which is removed.

A template used in imprint lithography according to an embodiment of the present invention has a first pattern having closed loop structure, the first pattern being used for forming a device pattern.

A method of creating pattern inspection data used in inspecting a pattern formed on a template used in imprint lithography or a second pattern formed by using the template according to an embodiment of the present invention, the method of creating pattern inspection data comprises: creating bias data in which an outer periphery of a pattern of rendering data for forming a template having a first pattern having close loop structure is moved in any one of an outward direction and an inward direction or both by a predetermined bias amount; and calculating, when two bias data are created by moving the outer periphery of the pattern in both the outward direction and the inward direction by the predetermined amount, a difference between two bias data and calculating, when one bias data is created by moving the outer periphery of the pattern in one of the outward direction and the inward direction by the predetermined amount, a difference between the bias data and the rendering data of the pattern to create first pattern inspection data.

BRIEF DESCRIPTION OF THE DRAWINGS

FIG. 13 is a schematic plan view of an example of a procedure for forming a device isolation pattern of a NAND flash memory;

DETAILED DESCRIPTION OF THE INVENTION

Exemplary embodiments of the present invention are explained in detail below with reference to the accompanying drawings. The present invention is not limited by the embodiments. Sectional views of templates and semiconductor devices used in the embodiments are schematic. A relation between the thickness and the width of a layer and a ratio of thicknesses of layers are different from actual ones. Thicknesses explained below are only examples. Thicknesses are not limited to these thicknesses.

In a first embodiment of the present invention, a template not subjected to closed loop removal processing is used to form hard masks for forming patterns having a minimum dimension and patterns having a dimension larger than that (hereinafter, "large patterns") on a film to be processed. Then, the closed loop removal processing for the hard masks is performed and the film to be processed is etched by using the hard masks.

In the following explanation, first, a method of manufacturing a template not subjected to the closed loop removal processing is explained and, then, a method of manufacturing a semiconductor device using the template is explained.

Figure 1:
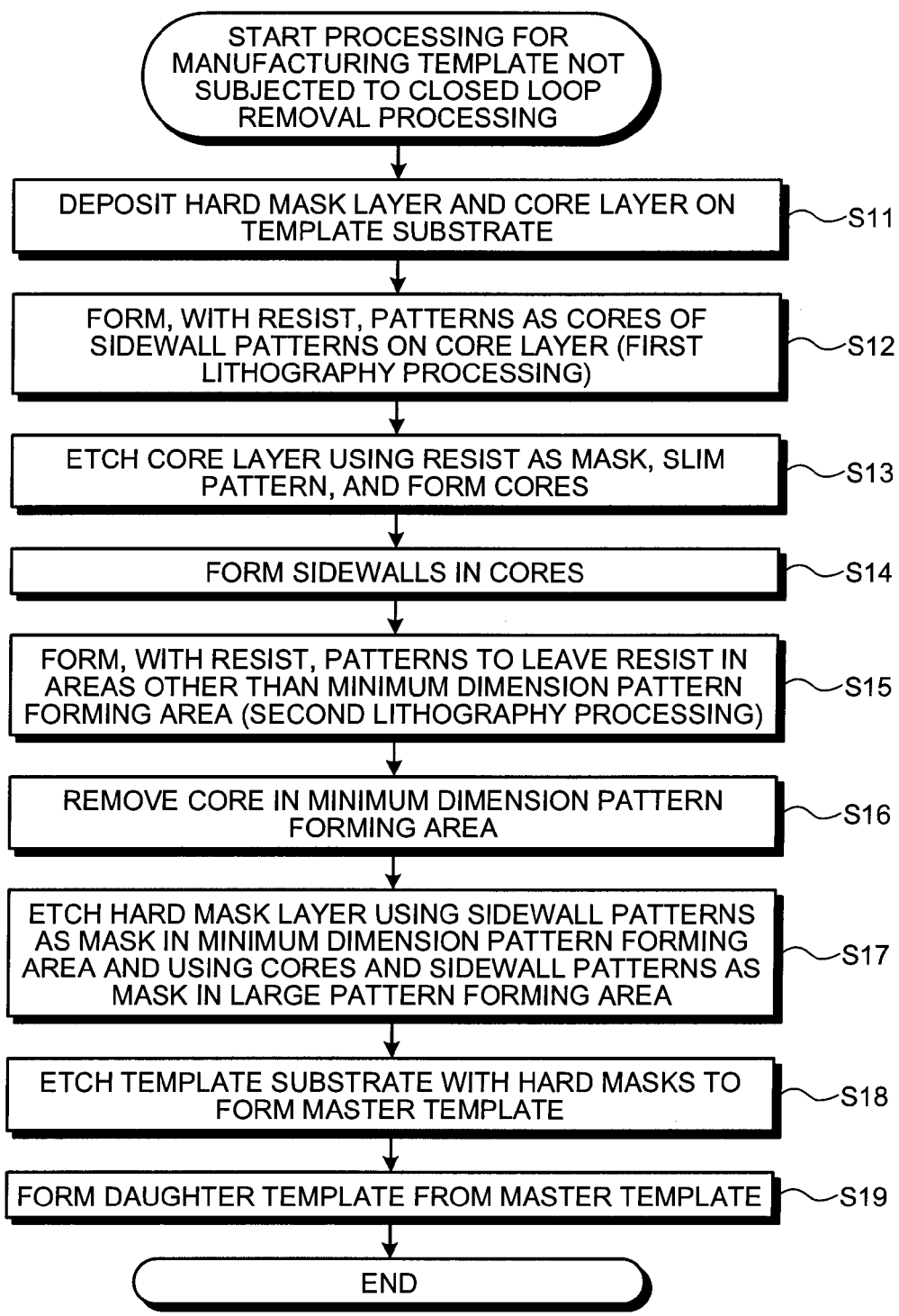
FIG. 1 is a flowchart for explaining an example of a processing procedure of a method of manufacturing a template according to a first embodiment.

FIG. 1 is a flowchart for explaining an example of a processing procedure of a method of manufacturing a template according to the first embodiment. FIGS. 2A to 2H are schematic sectional views of the example of the procedure of the method of manufacturing a template.

First, a hard mask layer 11A of Cr, MoSi, or the like as an etching mask for a template substrate 1A of quartz or the like and a core layer 12A as a core in a sidewall transfer process such as a silicon oxide film ($SiO_2$ film), a silicon nitride film (SiN film), or a polysilicon film are deposited in order on the template substrate 1A (step S11).

Subsequently, resist is applied over the core layer 12A and first lithography processing for forming resist patterns 21 for forming cores of sidewall patterns later is performed (step S12 in FIG. 2A). In the case of template formation, in general, the first lithography processing is performed in electron beam rendering. A pattern pitch and a resist dimension of the resist patterns 21 in a sidewall pattern section are about twice as large as a pitch and a dimension of a pattern on a final template. For example, when a dimension of 15 nanometers is finally required, the dimension of the resist patterns 21 formed on the core layer 12A is about 30 nanometers and the pitch of the resist patterns 21 is about 60 nanometers. The thickness of the resist patterns 21 is about 50 nanometers to 150 nanometers.

Thereafter, the core layer 12A as a base is etched by using the resist patterns 21 as masks to form a pattern of the core layer 12A. The dimension of the formed pattern is substantially the same as the dimension of the resist patterns 21. The formed pattern of the core layer 12A is slimmed by an etching process. As this slimming process, in general, an isotropic etching process such as a chemical dry etching (CDE) method or a wet method is used. The process depends on a hard mask material, controllability of a slimming amount, and the like. For example, when a SiN film is selected as the core layer 12A, wet etching or the like by hot phosphoric acid can be used. A standard of an amount to be slimmed by the slimming is about a half of a final dimension (for an end on one side). For example, when a dimension of 15 nanometers is finally necessary, the slimming amount is about 7.5 nanometers for one side. After the slimming process for the core layer 12A ends, the resist patterns 21 are peeled off. As a resist peeling process, in general, an ashing process ($O_2$ asher) or the liker in the oxygen atmosphere is used. Consequently, cores 12 are formed on the hard mask layer 11A (step S13 in FIG. 2B).

Figure 2A:
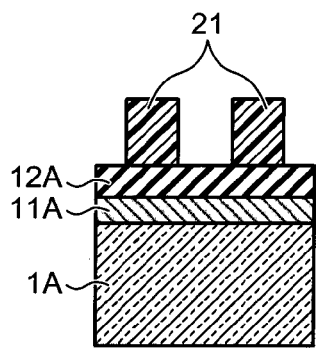
FIGS. 2A to 2H are schematic sectional views of the example of the procedure of the method of manufacturing a template.
Figure 2B:
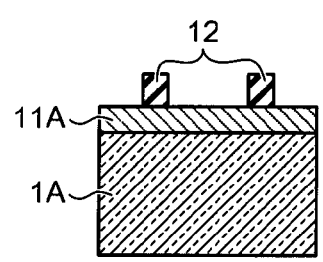
Figure 2C:
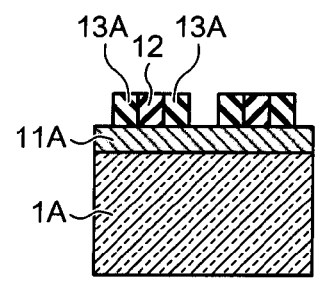
Figure 2D:
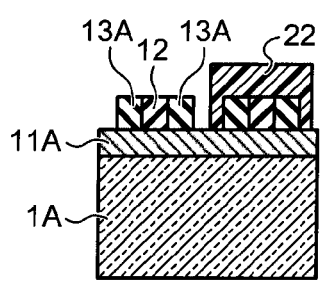
Figure 2E:
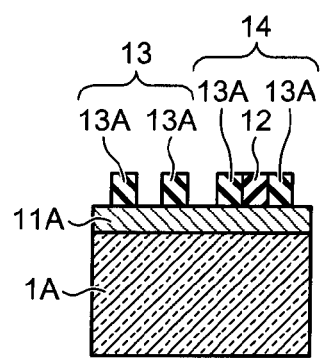

Sidewall patterns 13A are formed on sidewalls of patterns of the formed cores 12 (step S14 in FIG. 2C). Details of a sidewall pattern forming method are not explained. However, in general, a system for depositing an insulating film such as an oxide film or a nitride film as a sidewall material on the hard mask layer 11A, on which the cores 12 are formed, using a film forming method such as the CVD method or the sputtering method, etching back the insulating film with anisotropic etching to leave a pattern only in sidewall sections of the cores 12 is used. The dimension of the sidewall patterns 13A is set to substantially coincide with deposit thickness of the sidewall material and to be the same value as a minimum dimension of an integrated circuit in that generation. Because the dimension of the sidewall patterns 13A substantially coincides with the deposit thickness of the sidewall film, dimension controllability is extremely high.

Thereafter, resist is applied over the entire surface of the hard mask layer 11A on which the cores 12 having the sidewall patterns 13A are formed. Second lithography processing for forming a resist pattern 22 is performed to leave the core 12 in a section where the pattern is formed other than an area where minimum dimension patterns are formed (hereinafter, "minimum dimension pattern forming area") (step S15 in FIG. 2D). Consequently, the minimum dimension pattern forming area is exposed and the other area (e.g., an area where a peripheral circuit is formed) is covered with the resist pattern 22. The thickness of the formed resist pattern 22 is larger than the thickness of the resist patterns 21 in the first lithography processing.

The cores 12 among the cores 12 in which the exposed sidewall patterns are formed are removed by etching. As a method for this etching, in general, a vapor-phase HF processing method is known. Only the core 12 in the minimum dimension pattern forming area is removed. The core 12 outside the minimum dimension pattern forming area is not removed because the core 12 is covered with the resist pattern 22. Thereafter, the resist pattern 22 is peeled off. Consequently, in the minimum dimension pattern forming area, a first pattern 13 having a dimension and a pitch as final targets is formed by the sidewall pattern 13A. In an area other than the minimum dimension pattern forming area, a second pattern 14 by the core 12 having the sidewall patterns 13A is formed (step S16 in FIG. 2E). The minimum dimension patterns refer to patterns formed by using line and space patterns specified by the height of the sidewall patterns 13A formed in the sidewall transfer process. All patterns having other dimensions are referred to as large patterns. The minimum dimension patterns are, for example, patterns formed in a memory cell section of a NAND flash memory. The large patterns are patterns formed in a peripheral circuit section formed around the memory cell section.

Figure 2F:
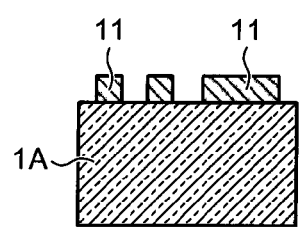
Figure 2G:
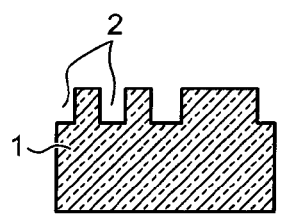

The hard mask layer 11 as a base is etched by using the first pattern 13 as a mask in the minimum dimension pattern forming area and using the second pattern 14 as a mask in the area other than the minimum dimension pattern forming area (step S17 in FIG. 2F). Consequently, the first pattern 13 and the second pattern 14 are transferred onto the hard mask layer 11A and hard masks 11 are formed.

Thereafter, the first pattern 13 and the second pattern 14 as the masks are removed by etching, the template substrate 1A is etched by using the hard masks 11 as masks, and the hard masks 11 are peeled off. Consequently, a master template 1 having grooves (recesses) 2 is formed (step S18 in FIG. 2G).

Figure 2H:
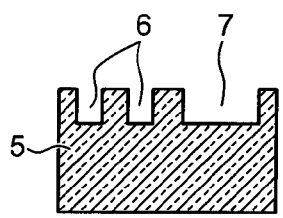

A daughter template 5 is formed from the master template 1 (step S19 in FIG. 2H). The daughter template 5 means a copy template. For mass production of integrated circuits using the nano-imprint method, it is necessary to manufacture a large quantity of such daughter templates 5. To manufacture the daughter template 5 from the master template 1, in general, nano-imprint lithography is used. The daughter template 5 is formed by reversing recesses and projections of the master template 1. Recesses 6 and 7 are formed in areas of projections of the master template 1. The recesses 6 are formed in the minimum dimension pattern forming area and the recesses 7 are formed in the other area.

Consequently, the processing for manufacturing a template ends. In the processing, the resist patterns 21 and 22 are used. However, processing patterns made of other materials can be used as long as the hard mask layer 11A and the core layer 12A can be processed.

Figure 3:
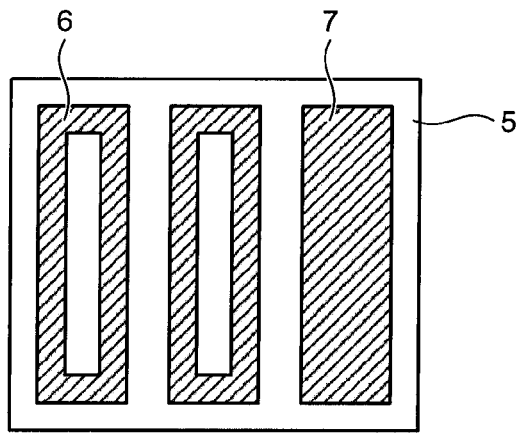
FIG. 3 is a plan view of an example of a daughter template manufactured by the method according to the first embodiment.

FIG. 3 is a plan view of an example of a daughter template manufactured by the method according to the first embodiment. As shown in FIG. 3, the recesses 6 formed in the minimum dimension pattern forming area of the daughter template 5 correspond to the sidewall patterns 13A and form closed loops. In the process explained above, because the daughter template 5 is formed by using the sidewall transfer process, the patterns formed at step S17 for removing the cores 12 and subsequent steps are formed in a closed loop shape. Therefore, in the past, at step S17 (FIG. 2F), the template substrate 1A is etched after processing for removing the closed loops is performed by the photolithography technology. However, in the first embodiment, the template substrate 1A is etched without performing the closed loop removal processing. This makes it possible to reduce processing steps for the manufacturing of a template.

Figure 4:
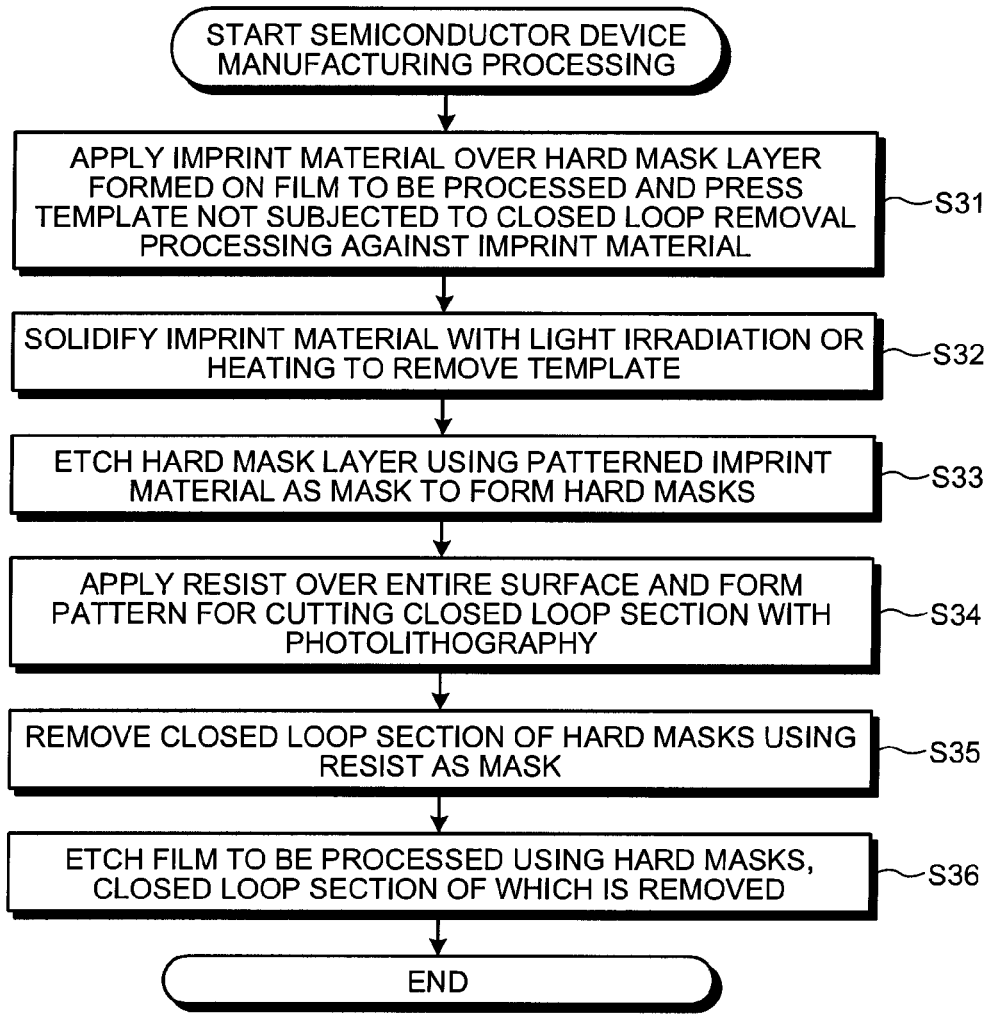
FIG. 4 is a flowchart for explaining an example of a procedure of a method of manufacturing a semiconductor device according to the first embodiment.

FIG. 4 is a flowchart for explaining an example of a procedure of a method of manufacturing a semiconductor device according to the first embodiment. FIGS. 5A to 5E are schematic sectional views of the example of the procedure of the method of manufacturing a semiconductor device. Processing of a silicon substrate is explained below with the silicon substrate (hereinafter also simply referred to as "substrate") as an example of a processing target film to be processed.

First, a hard mask layer 61A such as a silicon nitride film is formed on a silicon substrate 51, which is a film to be processed. Subsequently, an imprint material 71A made of a thermo-setting or photo-setting organic material is dropped on the hard mask layer 61A by a necessary quantity. A pattern forming surface of the daughter template 5 manufactured by the method of manufacturing a template and not subjected to the closed loop removal processing is pressed against the substrate 51 while being opposed to the hard mask layer 61A (step S31 in FIG. 5A). In this state, light such as an ultraviolet ray is irradiated on the substrate 51 or the substrate 51 is heated to solidify the imprint material 71A. Thereafter, the daughter template 5 is removed from the substrate 51, whereby resist patterns 71 are formed on the hard mask layer 61A (step S32 in FIG. 5B). As explained above, the daughter template 5 has the closed loop structure in the minimum dimension pattern forming area. Therefore, the resist patterns 71 also have the closed loop structure in the minimum dimension pattern forming area.

Figure 5A:
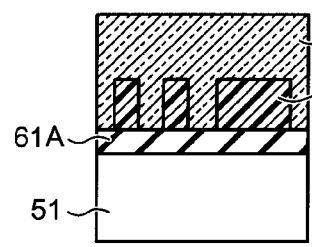
FIGS. 5A to 5E are schematic sectional views of the example of the procedure of the method of manufacturing the semiconductor device.
Figure 5B:
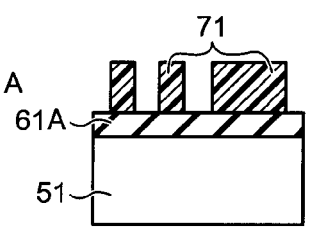
Figure 5C:
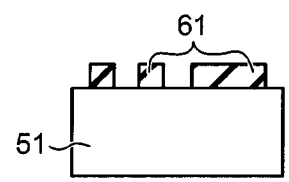

The hard mask layer 61A is etched by using the resist patterns 71 as masks to form hard masks 61 (step S33 in FIG. 5C). The hard masks 61 are formed by directly transferring a pattern shape of the daughter template 5. Therefore, in plan view, the hard masks 61 have the closed loop structure at ends of patterns in the minimum dimension pattern forming area.

Figure 5D:
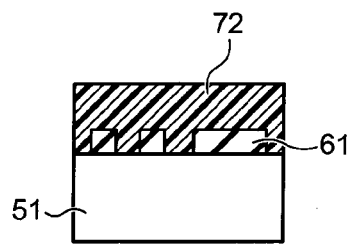

Thereafter, resist is applied over the substrate 51 on which the hard masks 61 are formed, a resist pattern 72 is formed by the lithography technology, and processing for removing closed loops of the hard masks 61 is performed (step S34 in FIG. 5D). Although the resist pattern 72 is used, processing patterns formed of other materials can be used as long as the substrate 51 can be processed.

Figure 6:
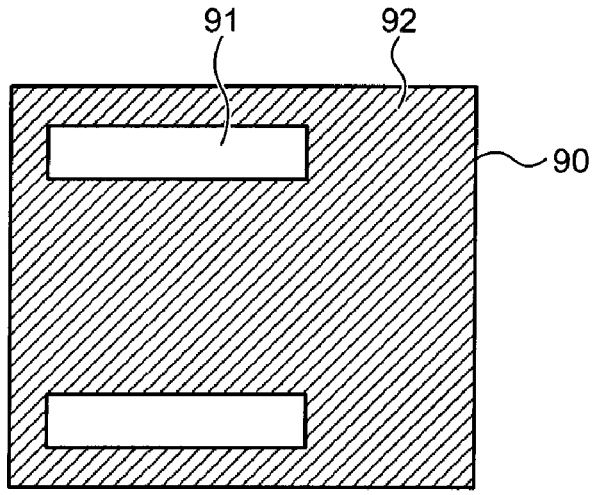
FIG. 6 is a diagram of an example of an exposure mask used during closed loop removal.

FIG. 6 is a diagram of an example of an exposure mask used during the closed loop removal. As shown in the figure, an exposure mask 90 used for cutting the closed loop has a pattern in which light transmitting sections (windows) 91 are provided on a transparent substrate covered with a light blocking film 92 such that light is irradiated on a line end of a line and space section of the hard masks 61 formed by nano-imprint. The exposure mask 90 used for exposure processing is desirably a mask with optical proximity effect (OPE) and process proximity effect (PPE) corrected by a mask pattern. Further, an ArF immersion exposing device can be used for the exposure processing. However, because a pattern size in an exposure process is larger than that in nano-imprint lithography, an exposing device that uses exposure light having longer wavelength can be used. This makes it possible to realize a reduction in process cost in a wafer process.

The resist pattern 72 with the resist removed only in an area corresponding to the closed loop section of the hard mask 61 is formed by using such an exposure mask 90. The hard masks 61 are etched by using the resist pattern 72 as a mask. The closed loop section of the hard masks 61 is removed. As a result, in the hard masks 61, masks corresponding to the line and space patterns are formed in the minimum dimension pattern forming area.

Figure 5E:
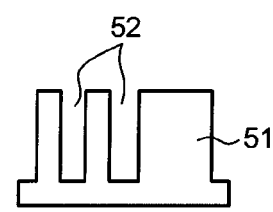

After the resist pattern 72 is removed, the substrate 51 as a film to be processed is etched by using the hard masks 61 subjected to the closed loop removal processing to form recesses 52 (step S36 in FIG. 5E). As explained above, processing for the film to be processed such as the substrate 51 is performed. Thereafter, processing is performed in the same manner as the manufacturing process for the semiconductor device in the past.

In the above explanation, the step of, after transferring the pattern of the daughter template 5 onto the hard mask layer 61A to form the hard masks 61, removing the closed loop pattern of the hard masks 61 is performed independently for that purpose. However, a step of removing a closed loop on a wafer in the step of manufacturing a semiconductor device can be merged with other steps. Even when the pattern is formed in the nano-imprint step and the closed loop removal processing is performed in the process on the wafer (the substrate) in this way, an increase in the number of steps, i.e., an increase is cost does not occur.

Figure 7:
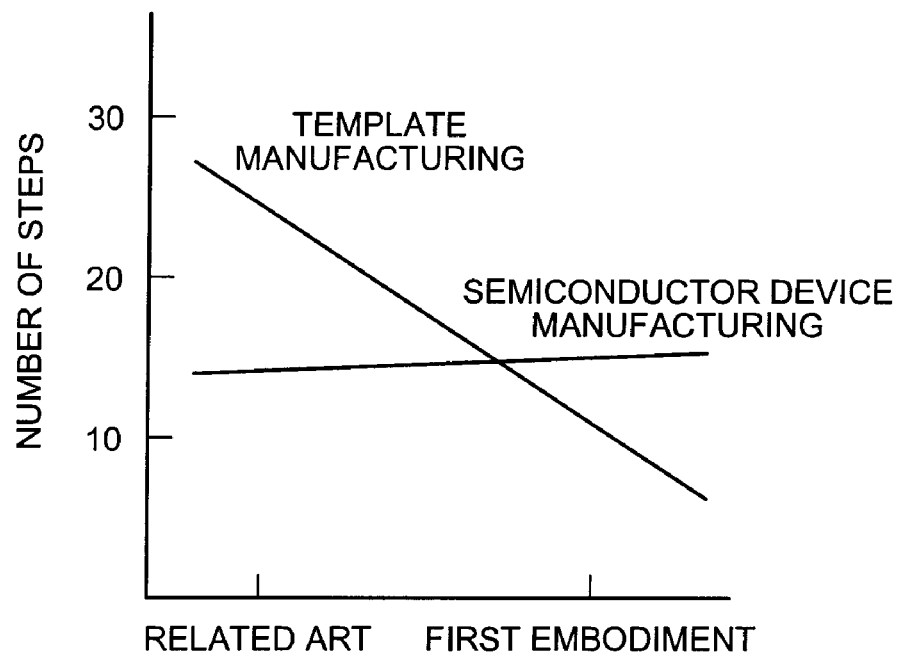
FIG. 7 is a diagram for comparing the numbers of steps in a related art and the first embodiment in manufacturing a semiconductor device using a nano-imprint method.

FIG. 7 is a diagram for comparing the numbers of steps in the related art and the first embodiment in manufacturing a semiconductor device using the nano-imprint method. When the larger patterns other than the minimum dimension patterns are formed on the template together with the minimum dimension patterns and the closed loop removal processing is performed on the template as in the related art, the number of steps for manufacturing the template is, for example, nearly thirty. This is because, to remove the closed loop of the sidewall pattern with, for example, the template manufacturing method disclosed in US Patent Application Publication No. 2008/0286449, a film forming step, a lithography step, an etching step, and a peeling step are added. The addition of such new steps makes the manufacturing process for a template more complicated and deteriorates yield of the template manufacturing. Because such template processing is processing in a micro-dimension, this causes an increase in cost. When a semiconductor device is manufactured by using a template manufactured through such a complicated process, manufacturing cost for the semiconductor device also increases.

On the other hand, as in the first embodiment, when the closed loop removal processing is not performed on the template, patterns having the closed loop structure are formed on the processing target substrate 51, and the closed loop removal processing is performed on the substrate 51, it is possible to reduce the number of steps for manufacturing a template to nearly one third. Even when the closed loop removal processing is performed on the substrate 51, because the closed loop removal processing can be merged with the other steps, the number of manufacturing steps for a semiconductor device hardly increases compared with the related art.

An example in which a closed loop removing step is merged with the other steps is explained. When a memory cell of a NAND flash memory is formed, if word lines are formed by patterning using a template not subjected to the closed loop removal processing, closed loop structure is formed at an end between an adjacent pair of word lines. For example, when the memory cell has floating gate structure, a step of removing the closed loop structure can be merged with a step of forming a resistance element or a capacitance element by etching an opening having a predetermined shape opened to predetermined depth of a floating gate electrode.

According to the first embodiment, when a semiconductor device is manufactured by the imprint method, a pattern is formed on a processing target by using a template not subjected to the closed loop structure removal processing to which an end between an adjacent pair of line and space patterns is connected. A closed loop pattern formed in the pattern on the processing target is removed by the lithography technology. This realizes an effect that it is possible to manufacture a semiconductor device having a desired characteristic without deteriorating manufacturing yield for templates. Further, there is an effect that it is possible to hold down cost for manufacturing of a template compared with that in the past and, because the number of manufacturing steps for a semiconductor device is not substantially increased, it is also possible to hold down cost for manufacturing of a semiconductor device compared with that in the past.

In the explanation in the first embodiment, a pattern is formed on a substrate using the template having the minimum dimension patterns and the large patterns other than the minimum dimension patterns and not subjected to the closed loop removal processing and closed loop removal is performed on the substrate. In a second embodiment of the present invention, after a pattern is formed on a substrate by using a template having the minimum dimension patterns and not subjected to the closed loop removal processing, patterns other than the minimum dimension patterns are formed on the substrate by lithography and the closed loop removal processing is performed.

Therefore, first, a method of manufacturing a template not subjected to the closed loop removal processing and having only the minimum dimension patterns is explained. Then, a method of manufacturing a semiconductor device using the template is explained.

Figure 8:
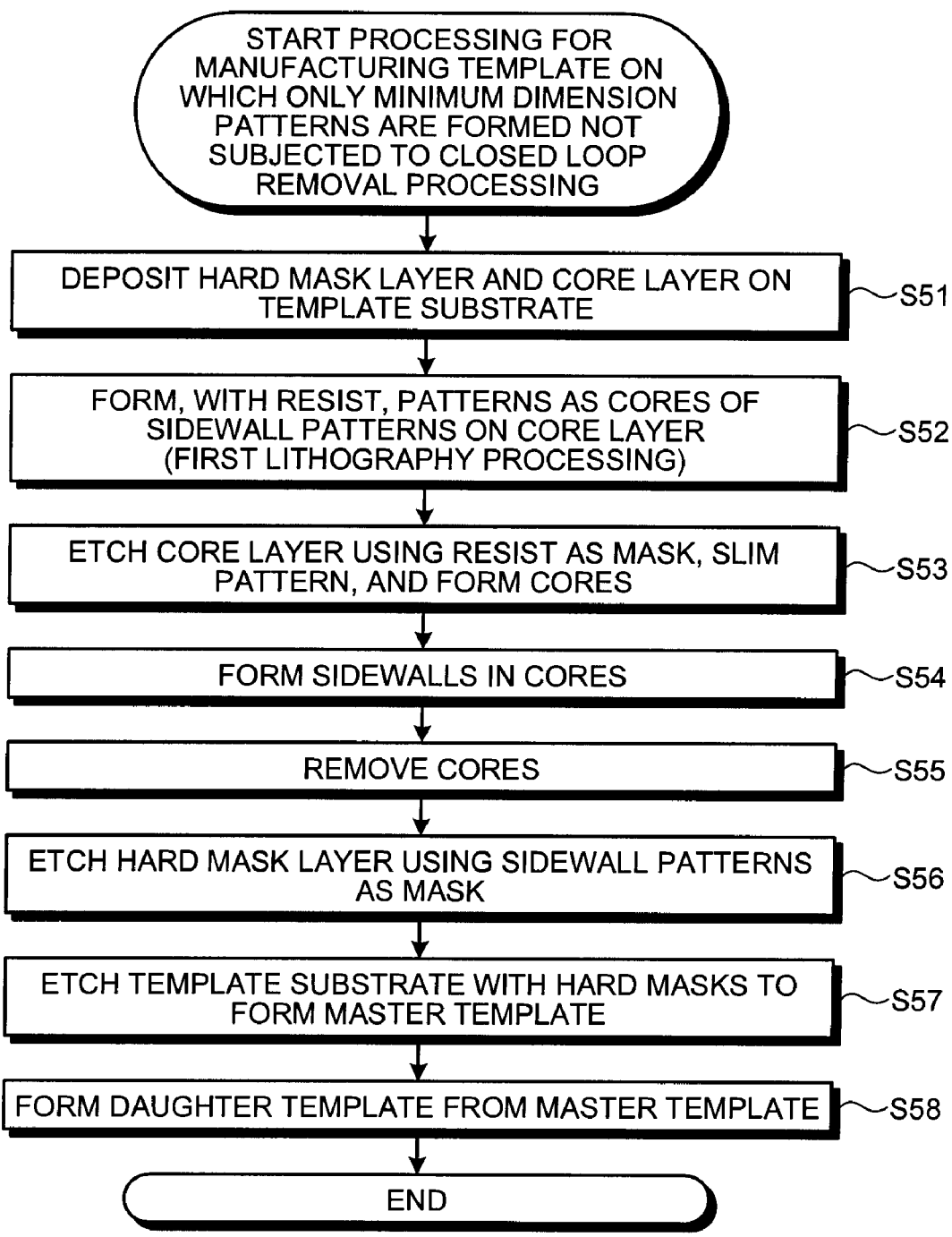
FIG. 8 is a flowchart for explaining an example of a processing procedure of a method of manufacturing a template according to a second embodiment of the present invention.

FIG. 8 is a flowchart for explaining an example of a processing procedure of a method of manufacturing a template according to the second embodiment. FIGS. 9A to 9D are schematic sectional views of the example of the procedure of the method of manufacturing a template.

First, as shown steps S11 to S14 and FIGS. 2A to 2C in the first embodiment, the hard mask layer 11A and the core layer 12A are deposited on the template substrate 1A in order and, after a pattern having a desired dimension and a desired pitch is formed on the core layer 12A by using the lithography technology and the etching technology to form the cores 12, the sidewall patterns 13A are formed in the cores 12 (steps S51 to S54).

Figure 9A:
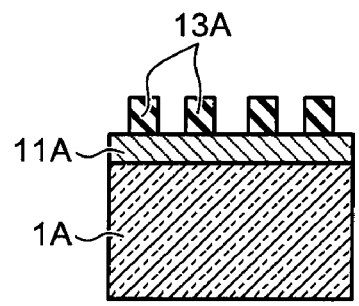
FIGS. 9A to 9D are schematic sectional views of the example of the procedure of the method of manufacturing a template.

Subsequently, the cores 12 among the cores 12 in which the sidewall patterns 13A are formed are removed by etching such as a VPC method (step S55 in FIG. 9A). Unlike the first embodiment, all the cores 12 formed on the template substrate 1A are removed.

Figure 9B:
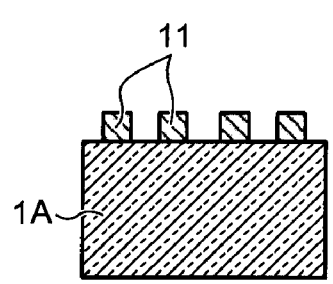
Figure 9C:
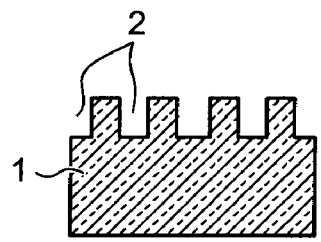
Figure 9D:
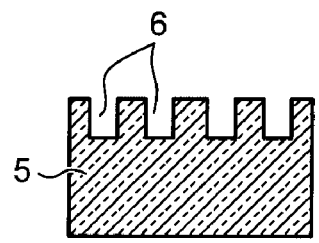

Thereafter, the hard mask layer 11A as a base is etched by using the sidewall patterns 13A as masks (step S56 in FIG. 9B). Consequently, the sidewall patterns 13A is transferred onto the hard mask layer 11A and the hard masks 11 are formed.

Subsequently, the sidewall patterns 13A as the mask are removed by etching and, after the template substrate 1A is etched by using the hard masks 11 as masks, the hard masks 11 are peeled off. Consequently, the master template 1 is formed (step S57 in FIG. 9C). The daughter template 5 is formed from the master template 1 (step S58 in FIG. 9D).

Figure 10:
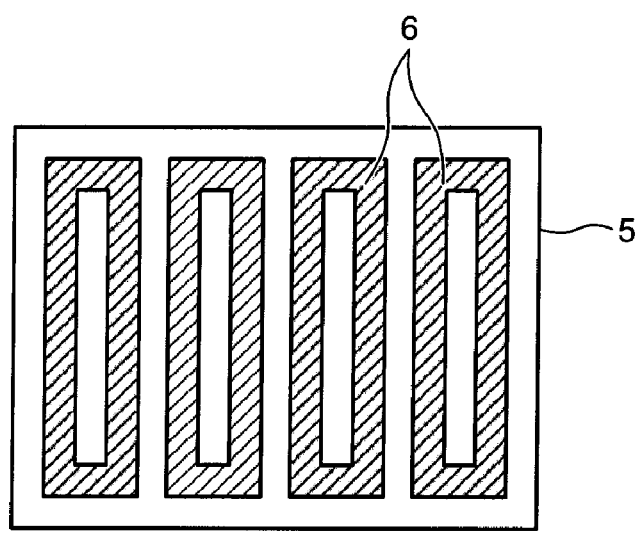
FIG. 10 is a plan view of an example of a daughter template manufactured by the method according to the second embodiment.

Consequently, the processing for manufacturing a template ends. FIG. 10 is a plan view of an example of a daughter template manufactured by the method according to the second embodiment. As shown in FIG. 10, patterns are formed on the daughter template 5 by the recesses 6. The patterns are line and space patterns having a minimum dimension. Ends of the patterns have closed loop structure. In the first embodiment, besides the minimum dimension patterns, the large patterns having other dimensions are also formed on the template. However, in the second embodiment, because only the minimum dimension patterns are formed on the template, lithography steps for forming large patterns on a template substrate can be reduced. Therefore, compared with the first embodiment, it is possible to further reduce processing steps for manufacturing a template.

Figure 11:
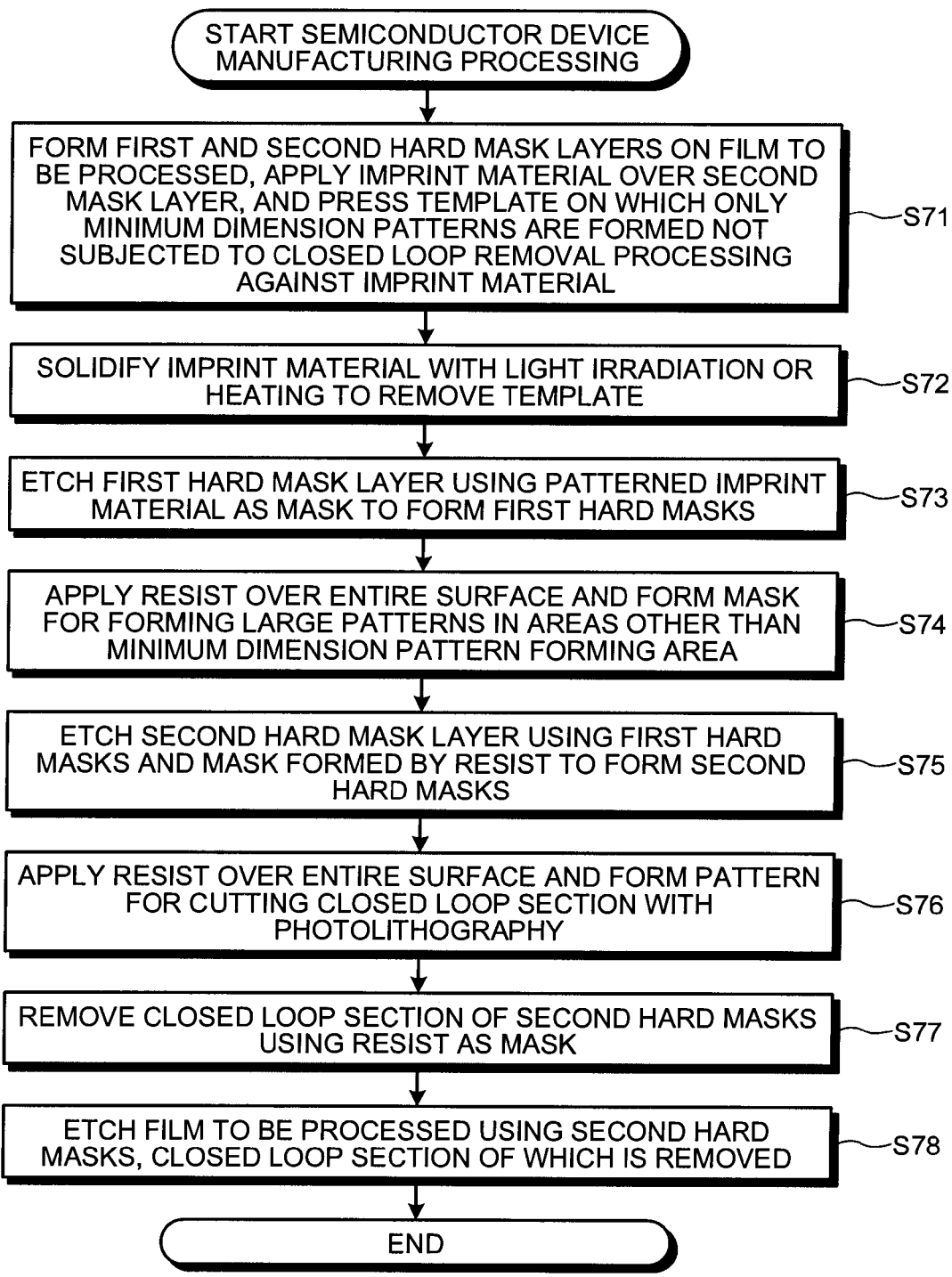
FIG. 11 is a flowchart for explaining an example of a procedure of a method of manufacturing a semiconductor device according to the second embodiment.

FIG. 11 is a flowchart for explaining an example of a procedure of a method of manufacturing a semiconductor device according to the second embodiment. FIGS. 12A to 12G are schematic sectional views of the example of the procedure of the method of manufacturing a semiconductor device.

First, a first hard mask layer 62A and a second hard mask layer 63A of different types are deposited in order on the processing target substrate 51 such as a silicon substrate. Examples of the first and second hard mask layers 62A and 63A include a silicon oxide film and a silicon nitride film. Subsequently, the imprint material 71A made of a thermosetting or photo-setting organic material is dropped on the second hard mask layer 63A by a necessary quantity. A pattern forming surface of the daughter template 5, on which only the minimum dimension patterns are formed, manufactured by the method of manufacturing a template and not subjected to the closed loop removal processing is pressed against the substrate 51 while being opposed to the second hard mask layer 63A (step S71 in FIG. 12A). In this state, light such as an ultraviolet ray is irradiated on the substrate 51 or the substrate 51 is heated to solidify the imprint material 71A. Thereafter, the daughter template 5 is removed from the substrate 51, whereby the resist patterns 71 are formed on the second hard mask layer 63A (step S72 in FIG. 12B).

Figure 12A:
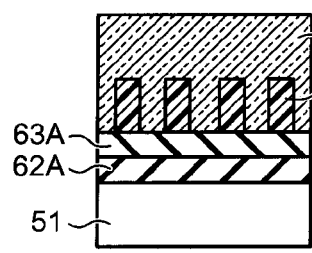
FIGS. 12A to 12G are schematic sectional views of the example of the procedure of the method of manufacturing a semiconductor device.
Figure 12B:
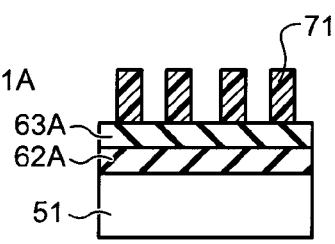
Figure 12C:
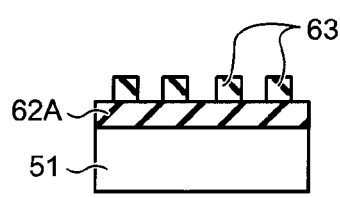

The second hard mask layer 63A is etched by using the resist patterns 71 as masks to form first hard masks 63 (step S73 in FIG. 12C). The first hard masks 63 are formed by directly transferring a pattern shape of the daughter template 5. Therefore, the first hard masks 63 have only the minimum dimension patterns and have the closed loop structure at ends of line and space patterns.

Figure 12D:
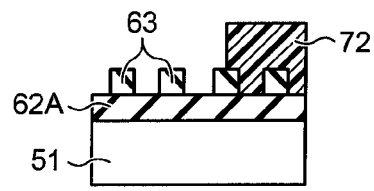
Figure 12E:
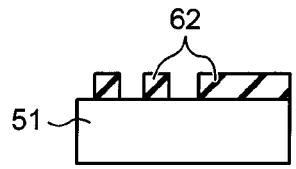

Thereafter, after resist is applied over the substrate 51 on which the first hard masks 63 are formed, the resist pattern 72 for forming large patterns such as a peripheral circuit in an area other than the minimum dimension pattern forming area is formed by the lithography technology (step S74 in FIG. 12D). Although the resist pattern 72 is used, processing patterns formed of other materials can be used as long as the substrate 51 can be processed. Thereafter, the first hard mask layer 62A is etched by using the first hard masks 63 and the resist pattern 72 as masks to form second hard masks 62 (step S75 in FIG. 12E). Consequently, masks of the minimum dimension patterns are formed in the minimum dimension pattern forming area and masks of the larger patterns are formed in the other area.

Figure 12F:
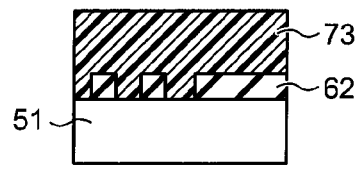

After resist is applied over the substrate 51 on which the second hard masks 62 are formed, processing for forming a resist pattern 73 for removing closed loops of the second hard masks 62 is performed by the lithography technology (step S76 in FIG. 12F). Although the resist pattern 73 is used, processing patterns formed of other materials can be used as long as the substrate 51 can be processed. Processing for forming the resist pattern 73 is the same as the processing explained in the first embodiment.

Thereafter, the exposed second hard masks 62 are etched by using the resist pattern 73 as a mask and a closed loop section of the second hard masks 62 is removed (step S77). The closed loop section is cut, whereby line and space patterns are formed.

Figure 12G:
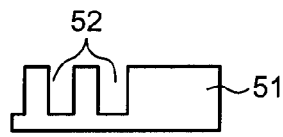

After the resist pattern 73 is removed, the substrate 51 is etched by using the second hard masks 62 subjected to the closed loop removal processing to form the recesses 52 (step S78 in FIG. 12G). As explained above, processing for the film to be processed such as the substrate 51 is performed. Thereafter, processing is performed in the same manner as the manufacturing process for the semiconductor device in the past.

In the step of manufacturing a semiconductor device, first, the closed loop removal processing for the second hard masks 62 is performed and, after that, the processing for forming a peripheral circuit is performed. However, the order of these steps can be reversed. The closed loop removal processing for the second hard mask 62 can be merged with other lithography steps of the step of manufacturing a semiconductor device.

A specific example of the method of manufacturing a semiconductor device according to the second embodiment is explained with a lithography process for forming a device isolation pattern of a NAND flash memory as an example. FIG. 13 is a schematic plan view of an example of a procedure for forming a device isolation pattern of a NAND flash memory. A device isolation pattern of a NAND flash memory 250 is roughly divided into a pattern called (memory) cell section 260 required to have finest line width and a pattern called peripheral circuit section 270 having line width larger than that of the cell section. In general, the pattern of the cell section 260 is often a simple repetition pattern such as line and space. The peripheral circuit section 270 is a random device circuit pattern designed by a device designer.

First, as indicated by step S91, first lithography processing for forming a resist pattern of the cell section 260 on a semiconductor substrate, on which a film to be processed is formed, by the nano-imprint lithography method using the daughter template 5 in which the recesses 6 are formed by the template manufacturing method is performed. The daughter template 5 is manufactured by using the sidewall transfer process as explained above. Therefore, minimum dimension patterns have the closed loop structure. Therefore, the film to be processed is etched by using the resist pattern as a mask to form a film-to-be-processed pattern. In the film-to-be-processed pattern, line and space patterns 201 are formed. An end 201A between an adjacent pair of line and space patterns 201 has structure connected by patterns.

After the first lithography processing is performed by the nano-imprint method, as indicated by step S92, resist is applied over the semiconductor substrate on which the film-to-be-processed pattern is formed and exposure processing (second lithography processing) for cutting closed loops (ends 201A) of the line and space patterns 201 is performed. An exposure mask 100 for forming a mask pattern used for cutting the closed loops is a pattern in which openings (windows) 102 are formed such that light is irradiated on the line ends 201A of the line and space patterns 201 formed by nano-imprint of a transparent substrate on which a light blocking film 101 is formed.

Thereafter, as indicated by step S93, resist is applied over the entire surface of the semiconductor substrate. Third lithography processing for formation of a peripheral circuit pattern 220 is applied to the semiconductor substrate by using the exposure mask 110. A laser beam is irradiated on the resist through the exposure mask 110 on which the peripheral circuit pattern 220 is formed.

Thereafter, the film to be processed is etched by using, as masks, a minimum dimension pattern 210 formed by nano-imprint lithography and the peripheral circuit pattern 220 formed by the third lithography processing. Processing patterns for device isolation are respectively formed in a minimum dimension pattern forming area and a peripheral circuit pattern forming area.

The processing for forming a peripheral circuit pattern is performed after the closed loop removal processing at step S92. However, the order of these kinds of processing can be reversed.

Effects same as those in the first embodiment can be obtained by the second embodiment.

In a third embodiment of the present invention, a template is manufactured by a method different from those explained in the first and second embodiments.

Figure 14A:
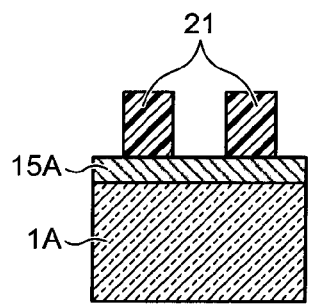
FIGS. 14A to 14G are sectional views of an example of a procedure of a method of manufacturing a template according to a third embodiment of the present invention.

FIGS. 14A to 14G are sectional views of an example of a procedure of a method of manufacturing a template according to the third embodiment. First, a hard mask layer 15A of Cr, MoSi, or the like as an etching mask for the template substrate 1A of quartz or the like is deposited on the template substrate 1A. Subsequently, resist is applied over the hard mask layer 15A and the first lithography processing is performed to form the resist patterns 21 for forming cores of sidewall patterns later (FIG. 14A). The formation of the resist pattern 21 is the same as that explained in the first embodiment.

Thereafter, the hard mask layer 15A as a base is etched by using the resist patterns 21 as masks to form patterns of cores 15. In the first embodiment, two layers of the hard mask layer 11A and the core layer 12A are laminated on the template substrate 1A and the cores 12 are formed from the core layer 12A. However, in the third embodiment, only one layer of the hard mask layer 15A is deposited on the template substrate 1A. Therefore, the cores 15 are formed from the hard mask layer 15A.

Figure 14B:
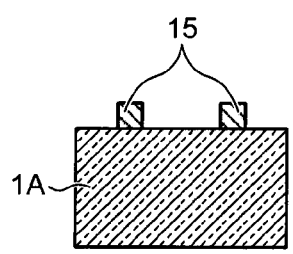

Subsequently, slimming of the formed cores 15 is performed by using an isotropic etching process such as the CDE method or the wet method (FIG. 14B). A standard of an amount to be slimmed by the slimming is about a half of a final dimension (around one side). After the sliming process for the cores 15 ends, the resist patterns 21 are peeled off.

Figure 14C:
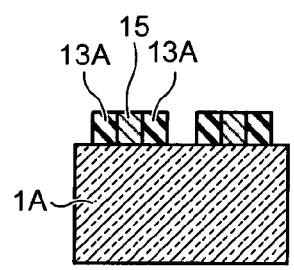

The sidewall patterns 13A are formed on sidewalls of patterns of the formed cores 15 (FIG. 14C). Details of a method of forming the sidewall patterns 13A are not explained. However, in general, an insulating film such as an oxide film or a nitride film as a sidewall material is deposited on the template substrate 1A, on which the cores 15 are formed and etched back to leave the sidewall patterns 13A only in sidewall sections of the cores 15. The dimension of the sidewall patterns 13A is set to substantially coincide with deposit thickness of the sidewall material and to be the same value as a minimum dimension of an integrated circuit in that generation. Because the dimension of the sidewall patterns 13A substantially coincides with the deposit thickness of the sidewall material, dimension controllability is extremely high.

Figure 14D:
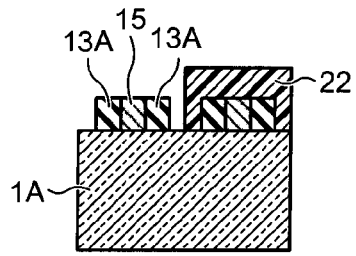

Thereafter, resist is applied over the entire surface of the template substrate 1A on which the cores 15 having the sidewall patterns 13A are formed. The second lithography processing for forming the resist pattern 22 is performed to leave the core 15 in a large pattern forming area other than a minimum dimension pattern forming area. (FIG. 14D). Consequently, the minimum dimension pattern forming area is exposed and the other large pattern forming area is covered with the resist pattern 22. The thickness of the formed resist pattern 22 is larger than the thickness of the resist patterns 21 in the first lithography processing.

Figure 14E:
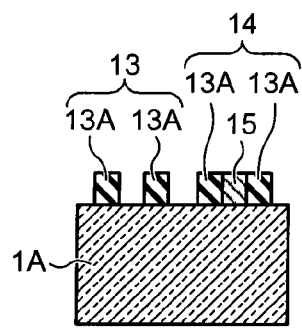

The core 15 in the minimum dimension pattern forming area is removed by an etching method such as the VPC method (FIG. 14E). The core 15 in the large pattern forming area other than the minimum dimension pattern forming area is not removed because the core 15 is covered with the resist pattern 22. The resist pattern 22 is peeled off. Consequently, the pattern 13 including the sidewall patterns 13A having a final target dimension and a final target pitch is formed in the minimum dimension pattern forming area. A pattern 14 including the core 15 having the sidewall patterns 13A is formed in the large pattern forming area.

Figure 14F:
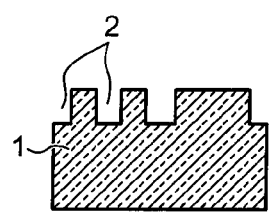
Figure 14G:
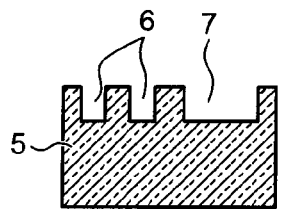

Thereafter, the template substrate 1A as a base is etched by using the pattern 13 as a mask in the minimum dimension pattern forming area and is etched by using the pattern 16 as a mask in the large pattern forming area (FIG. 14F). Consequently, in the template substrate 1A, the master template 1 having the recesses 2 in sections other than the patterns 13 and 16 is formed. The daughter template 5 is formed from the master template 1 by a method such as nano-imprint lithography (FIG. 14G). In the daughter template 5, recesses and projections of the master template 1 are reversed. The projections of the master template 1 are the recesses 6.

In the processing, the resist patterns 21 and 22 are used. However, processing patterns made of other materials can be used as long as the hard mask layer 15A can be processed.

A method of manufacturing a semiconductor device using the daughter template 5 formed in this way is the same as that explained in the first embodiment. Therefore, explanation of the method is omitted.

In the above explanation, the method corresponds to the method of manufacturing a template according to the first embodiment. However, the method can also be applied to the method of manufacturing a template according to the second embodiment. In this case, because only a minimum dimension pattern is formed, the processing for forming the resist patterns 22 in the large pattern forming area in FIG. 14D is unnecessary (i.e., the second lithography processing is unnecessary). The method is the same as the explanation except that all the cores 15 are removed in FIG. 14E.

According to the third embodiment, when a template is manufactured, only one layer of the hard mask layer 15A necessary for forming the hard masks (the patterns 13 and 16) for etching the template substrate 1A is formed on the template substrate 1A. The pattern 13 having the minimum dimension pattern is formed from the hard mask layer 15A by the sidewall transfer process. Therefore, compared with the first and second embodiments, the third embodiment has an effect that the number of steps of manufacturing a template can be reduced in addition to the effects of the first and second embodiments.

In a fourth embodiment of the present invention, in the method of manufacturing a template according to the first embodiment, the minimum dimension patterns and the other patterns (the large patterns) are dividedly created at a stage before the patterns are transferred onto the hard mask layer.

Figure 15A:
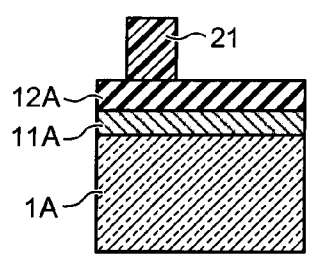
FIGS. 15A to 15H are sectional views of an example of a procedure of a method of manufacturing a template according to a fourth embodiment of the present invention.

FIGS. 15A to 15H are sectional views of an example of a procedure of a method of manufacturing a template according to the fourth embodiment. First, the hard mask layer 11A of Cr, MoSi, or the like as an etching mask for the template substrate 1A of quartz or the like and the core layer 12A as a core in a sidewall transfer process such as a silicon oxide film ($SiO_2$ film), a silicon nitride film (SiN film), or a polysilicon film are deposited in order on the template substrate 1A. Subsequently, resist is applied over the core layer 12A and first lithography processing for forming the resist pattern 21 for forming cores of sidewall patterns later is performed only in the minimum dimension pattern forming area (FIG. 15A).

Figure 15B:
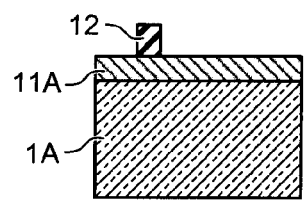

Thereafter, the core layer 12A as a base is etched by using the resist pattern 21 as a mask to form a pattern of the core layer 12A. Subsequently, slimming is applied to the formed pattern of the core layer 12A by using an isotropic etching process such as the CDE method or the wet method. After the slimming process for the core layer 12A ends, the resist pattern 21 is peeled off. Consequently, the core 12 is formed only in the minimum dimension pattern forming area (FIG. 15B).

Figure 15C:
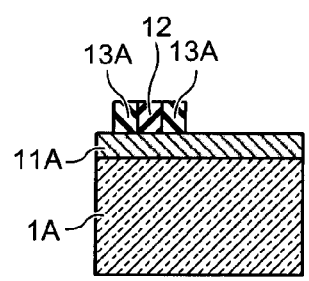
Figure 15D:
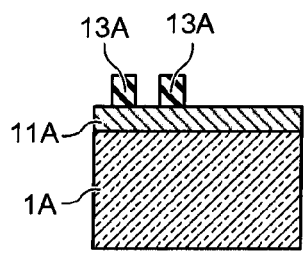

The sidewall patterns 13A are formed on sidewalls of the formed core 12 (FIG. 15C). For example, the sidewall patterns 13A can be formed only in sidewall sections of the core 12 by, after depositing an insulating film such as an oxide film or a nitride film as a sidewall material on the hard mask layer 11A on which the core 12 is formed, etching back the insulating film. The core 12 is formed only in the minimum dimension pattern forming area and is not formed in the large pattern forming area. Thereafter, the core 12 is removed by an etching method such as the VPC method (FIG. 15D).

Figure 15E:
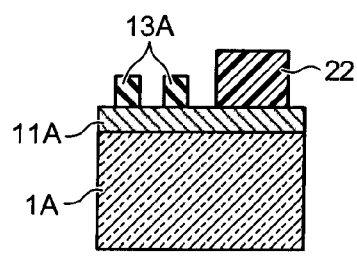
Figure 15F:
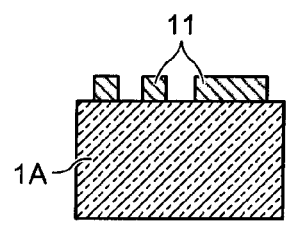
Figure 15G:
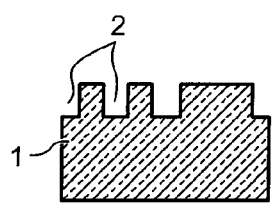
Figure 15H:
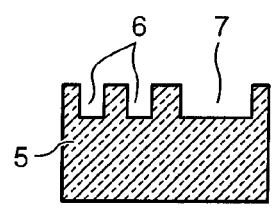

Resist is applied over the hard mask layer 11A on which the sidewall patterns 13A are formed. The second lithography processing for forming the resist pattern 22 for forming large patterns other then the minimum dimension patterns is performed (FIG. 15E). Thereafter, the hard mask layer 11A is etched by using the sidewall patterns 13A as masks in the minimum dimension pattern forming area and using the resist pattern 22 as a mask in the large pattern forming area to form the hard masks 11 (FIG. 15F). Further, the template substrate 1A is etched by using the hard masks 11 as masks to form the master template 1 (FIG. 15G). In the master template 1, the recesses (grooves) 2 are formed in sections where the hard masks 11 are not formed. The daughter template 5 is formed from the master template 1 by a method such as the nanoimprint lithography method (FIG. 15H). In the daughter template 5, recesses and projections of the master template 1 are reversed. Sections corresponding to the projections of the master template 1 are the recesses 6. Consequently, the processing for manufacturing a template ends.

In the processing, the resist patterns 21 and 22 are used. However, processing patterns made of other materials can be used as long as the hard mask layer 11A and the core layer 12A can be processed.

A method of manufacturing a semiconductor device using the template formed as explained above is the same as that explained in the first embodiment. Therefore, explanation of the method is omitted.

Effects same as those in the first embodiment can be obtained by the fourth embodiment.

In the past, there is no data for inspecting a pattern shape of a manufactured template and a pattern shape formed on a film to be processed formed by the template. Therefore, it is impossible to check whether these pattern shapes are correctly manufactured based on rendering data of the template. Therefore, in a fifth embodiment of the present invention, a method of creating pattern inspection data used for inspecting the master template and the daughter template manufactured in the first to fourth embodiment and patterns transferred onto a film to be processed using imprint lithography as explained in the first to fourth embodiments is explained.

Figure 16:
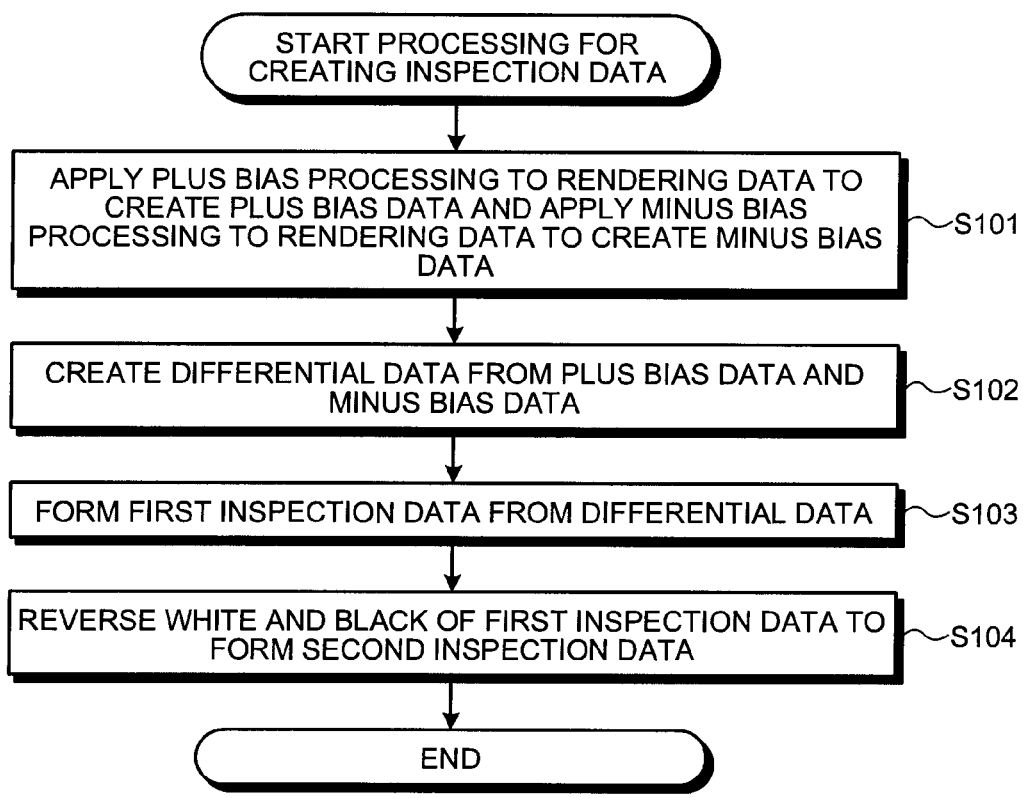
FIG. 16 is a flowchart for explaining an example of a procedure of a method of creating pattern inspection data.

FIG. 16 is a flowchart of an example of a procedure of a method of creating pattern inspection data. FIGS. 17A to 17F and FIGS. 18A to 18E are schematic diagrams of the example of the procedure of the method of creating pattern inspection data. Specifically, FIGS. 17A to 17E are diagrams of a procedure of a method of creating pattern inspection data for inspecting a master template and a daughter template not subjected to the closed loop removal processing having minimum dimension patterns and large patterns and inspecting patterns formed on a film to be inspected using the daughter template. FIGS. 18A to 18E are diagrams of a procedure of a method of creating pattern inspection data for inspecting a master template and a daughter template not subjected to the closed loop removal processing having only minimum dimension patterns and inspecting patterns formed in a film to be processed using the daughter template.

Figure 17A:
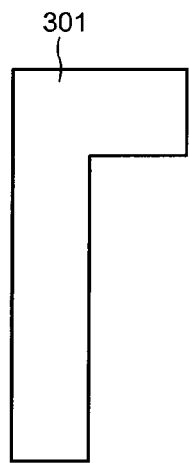
FIGS. 17A to 17F are schematic diagrams of an example of the procedure of the method of creating pattern inspection data.
Figure 17B:
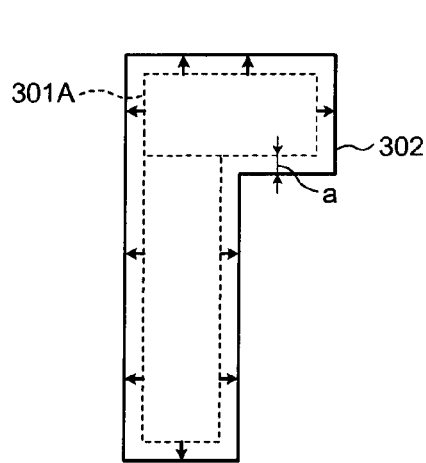
Figure 17C:
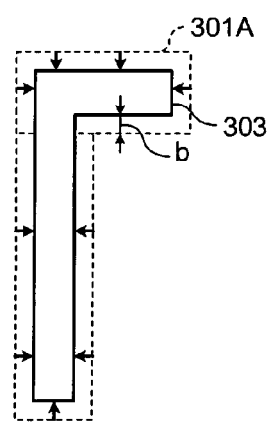
Figure 18A:
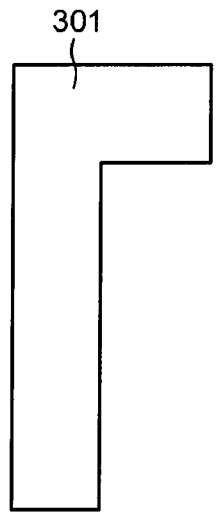
FIGS. 18A to 18E are schematic diagrams of the example of the procedure of the method of creating pattern inspection data.
Figure 18B:
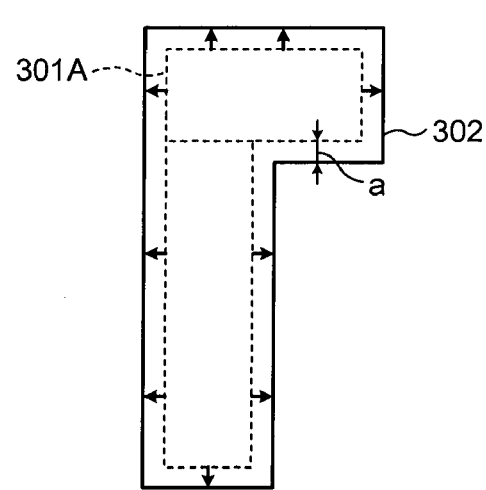
Figure 18C:
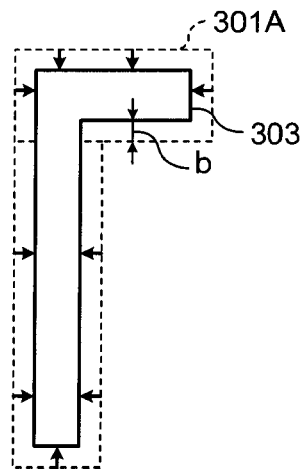

First, plus bias processing is applied to rendering data 301 used in manufacturing a template shown in FIGS. 17A and 18A to create plus bias data 302 (FIGS. 17B and 18B). Minus bias processing is applied to the rendering data 301 to create minus bias data 303 (steps S101 in FIGS. 17C and 18C). The plus bias processing is processing for thickening an outer peripheral section 301A of pattern data included in the rendering data 301 by a predetermined amount "a". The minus bias processing is processing for thinning the outer peripheral section 301A of the pattern data included in the rendering data 301 by a predetermined amount "b". A standard of the bias amounts "a" and "b" is a half of a minimum line width on a circuit. It is desirable that absolute values of the plus bias amount "a" and the minus bias amount "b" are equal (|a|=|b|). However, the absolute values of the plus bias amount "a" and the minus bias amount "b" can be changed according to characteristics of a template manufacturing process and a wafer process in use.

Figure 17D:
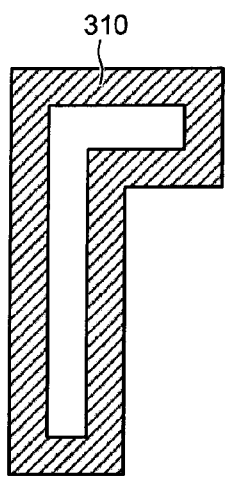

Subsequently, differential data 310 is created by using the plus bias data 302 and the minus bias data 303 (step S102 in FIGS. 17D and 18D). When viewed from the rendering data 301 of the original template, the differential data 310 is formed in a loop shape surrounding the rendering data 301 of the template. A section where the plus bias data 302 and the minus bias data 303 overlap each other is represented as a white area because data is not present in the section. A section where the plus bias data 302 and the minus bias data 303 do not overlap each other is represented as a black area because any one of the data is present in the section. The black area is formed in the loop shape. The section of the loop shape corresponds to a sidewall pattern.

Figure 17E:
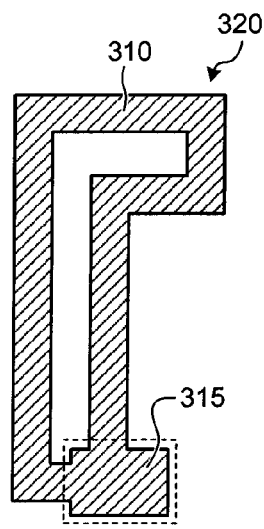

Thereafter, first pattern inspection data 320 is created from the differential data 310 (step S103). As explained in the first, third, and fourth embodiments, when an inspection target template or patterns manufactured from the template have minimum dimension patterns and large patterns, a large pattern 315 is added to the differential data 310 to create the first pattern inspection data 320 (FIG. 17E). The first pattern inspection data 320 is used for inspection of the master template 1 not subjected to the closed loop removal processing in which minimum dimension patterns and large patterns are formed and the patterns formed on the film to be processed manufactured in imprint lithography using the daughter template 5 as explained in the first, third, and fourth embodiments.

Figure 18D:
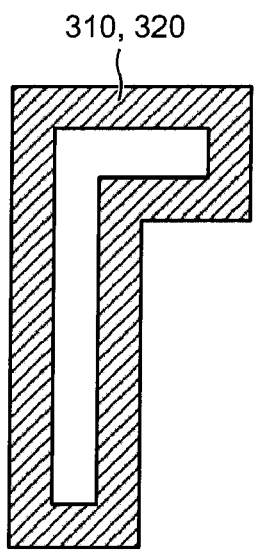

As shown in FIGS. 18A to 18E, in the case of pattern inspection data used for the master template 1 and the daughter template 5 not subjected to the closed loop removal processing having only minimum dimension patterns and the patterns on the film to be processed formed by using the daughter template 5, it is unnecessary to add the large pattern. Therefore, the differential data 310 obtained at step S102 directly becomes the first pattern inspection data 320 (FIG. 18D).

Figure 17F:
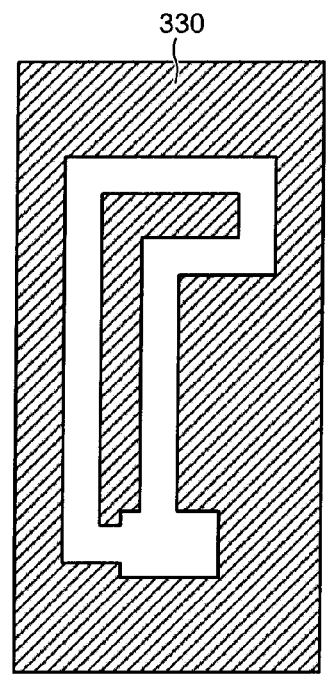
Figure 18E:
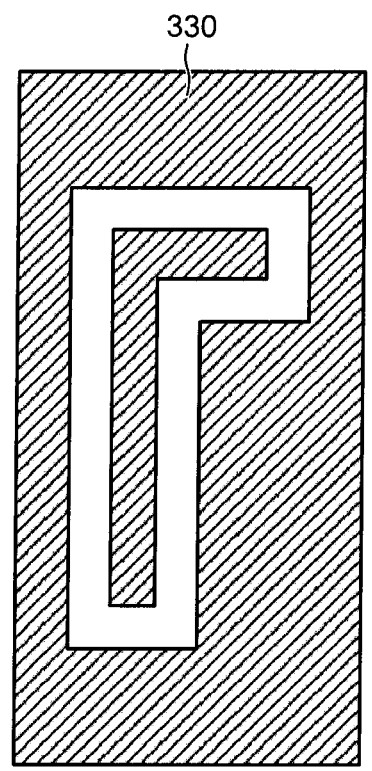

Further, second pattern inspection data 330 is created by reversing white and black of the first pattern inspection data 320 (step S104 in FIGS. 17F and 18E). The second pattern inspection data 330 is used for inspection of the daughter template 5 not subjected to the closed loop removal processing in which minimum dimension patterns and large patterns are formed explained in the first, third, and fourth embodiments. Consequently, the processing for creating pattern inspection data ends.

In the processing, the plus bias processing and the minus bias processing are performed to acquire the differential data 310 of the plus bias data 302 and the minus bias data 303. However, it is also possible to perform any one of the plus bias processing and the minus bias processing to set a difference between bias data of the bias processing and the rendering data 301 as differential data.

As explained above, the first pattern inspection data 320 created as explained above is used for inspection of the master template 1 and the patterns on the film to be processed formed by using the daughter template 5. The second pattern inspection data 330 is used for inspection of the daughter template 5. This pattern inspection method is performed by, for example, imaging the manufactured master template 1, daughter template 5, and patterns on the films to be processed using an imaging apparatus or the like to acquire image data thereof and causing an information processing apparatus or the like to execute processing for comparing the acquired image data and the first or second pattern inspection data 320 and 330 obtained by the method of creating pattern inspection data.

It is also possible to provide a computer program for causing a computer to execute the method of creating pattern inspection data and the pattern inspection method. The program for causing a computer to execute the method of creating pattern inspection data or the pattern inspection method is provided while being recorded in a computer-readable recording medium such as a compact disk-read only memory (CD-ROM), a floppy (registered trademark) disk, or a digital versatile disk or digital video disk (DVD) as a file of an installable format or an executable format. The program for causing a computer to execute the method of creating pattern inspection data or the pattern inspection method can be stored on a computer connected to a network such as the Internet and provided by being downloaded through the network.

By providing the computer program for causing a computer to execute the method of creating pattern inspection data or the pattern inspection method in this way, the method of creating pattern inspection data or the pattern inspection method can be executed by an information processing apparatus such as a personal computer including arithmetic means such as a central processing unit (CPU), storing means such as a read only memory (ROM) and a random access memory (RAM), secondary storing means such as a hard disk drive (HDD), external storing means such as a CD-ROM drive device, display means such as a display, and input means such as a keyboard and a mouse and including, when necessary, network interface means such as a network board. In this case, the computer program for causing a computer to execute the method of creating pattern inspection data or the pattern inspection method installed in the secondary storing means is expanded in the storing means such as the RAM and executed by the arithmetic means, whereby the methods are performed.

According to the fifth embodiment, there is an effect that it is possible to inspect whether the master template 1 and the daughter template 5 manufactured based on the rendering data 301 and the patterns on the film to be processed manufactured from the daughter template 5 by imprint lithography have desired patterns.

In the example explained above, the semiconductor device is manufactured by using the daughter template 5 manufactured from the master template 1. However, the master template 1 can be directly used for the manufacturing of the semiconductor device.

As explained above, according to the embodiments of the present invention, it is possible to manufacture a template using the sidewall transfer process without deteriorating manufacturing yield for templates and it is possible to simplify a manufacturing process for a semiconductor device compared with the manufacturing by the imprint lithography method in the past.

Further, according to the embodiments of the present invention, there is an effect that it is possible to check whether a shape of a manufactured template and patterns for forming a film to be processed formed by the template are correctly manufactured based on rendering data of the template.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device comprising:
    forming a first mask layer on a processing target;
    pressing a template having a first pattern having closed loop structure against the first mask layer via an imprint material and solidifying the imprint material to perform imprint;
    etching the first mask layer using the solidified imprint material as a mask to form a first mask including a second pattern having the closed loop structure;
    forming a first processing pattern above the first mask;
    performing, using the first processing pattern, removal of the closed loop structure by removing a part of the second pattern of the first mask to form a second mask; and
    etching the processing target using the second mask including the second pattern, the part of which is removed.

2. The method of manufacturing a semiconductor device according to claim 1, wherein the template includes the first pattern having the closed loop structure and a third pattern not having the closed loop structure.

3. The method of manufacturing a semiconductor device according to claim 1, wherein the removal of the closed loop structure is performed simultaneously with other processing.

4. The method of manufacturing a semiconductor device according to claim 3, wherein
    the first pattern is a pattern for forming word lines of a NAND flash memory including a memory cell having a floating gate structure, and
    the removal of the closed loop structure is performed simultaneously with processing for forming an opening having a predetermined shape in a floating gate electrode of the memory cell to form a resistance element or a capacitance element.

5. The method of manufacturing a semiconductor device according to claim 1, further comprising:
    forming a second mask layer on the processing target before forming the first mask layer after;
    using, in the imprint, the template on which only the first pattern having the closed loop structure is formed; and
    forming, after forming the first mask and before etching the processing target, a second processing pattern on the second mask layer on which the first mask is formed and etching the second mask layer using the first mask and the second processing pattern to form the second mask.

6. The method of manufacturing a semiconductor device according to claim 5, wherein the second processing pattern is formed by a photolithography technology.

7. The method of manufacturing a semiconductor device according to claim 1, wherein
    the first pattern has the closed loop structure in which ends of patterns forming an adjacent pair of line sections are connected, and
    the removing the closed loop structure is removing an end of a line of the second pattern formed by the first pattern.

* * * * *